(12) United States Patent
Shieh

(10) Patent No.: US 6,721,917 B2
(45) Date of Patent: Apr. 13, 2004

(54) METHOD AND SYSTEM FOR OPTICAL DISK DECODING

(75) Inventor: Jia-Horng Shieh, Junghe (TW)

(73) Assignee: Acer Laboratories, Inc. (TW)

( * ) Notice: Subject to any disclaimer, the term of this patent is extended or adjusted under 35 U.S.C. 154(b) by 328 days.

(21) Appl. No.: 09/742,408

(22) Filed: Dec. 22, 2000

(65) Prior Publication Data

US 2001/0056562 A1 Dec. 27, 2001

(30) Foreign Application Priority Data

Jun. 16, 2000 (TW) .................................. 089111797

(51) Int. Cl.[7] .............................................. H03M 13/00
(52) U.S. Cl. ..................................... 714/755; 714/785
(58) Field of Search ................................ 714/755, 756, 714/784, 752, 757–758, 763, 772, 774, 785, 769

(56) References Cited

U.S. PATENT DOCUMENTS

| | | | | | |
|---|---|---|---|---|---|
| 4,748,628 A | * | 5/1988 | Moriwaki | .................... | 714/758 |
| 4,881,232 A | * | 11/1989 | Sako et al. | .................. | 714/755 |
| 5,408,477 A | * | 4/1995 | Okada et al. | ................ | 714/755 |
| 5,408,478 A | * | 4/1995 | Ohmori et al. | .............. | 714/756 |
| 5,412,667 A | * | 5/1995 | Havemose | .................. | 714/756 |
| 5,436,917 A | * | 7/1995 | Karasawa | .................... | 714/755 |
| 5,712,861 A | * | 1/1998 | Inoue et al. | ................. | 714/752 |
| 5,778,011 A | * | 7/1998 | Blaum et al. | ............... | 714/755 |
| 5,907,564 A | * | 5/1999 | Jochijms et al. | ............ | 714/756 |
| 5,920,578 A | * | 7/1999 | Zook | .......................... | 714/755 |
| 5,944,848 A | * | 8/1999 | Huang | ....................... | 714/784 |
| 5,991,911 A | * | 11/1999 | Zook | .......................... | 714/758 |
| 6,041,431 A | * | 3/2000 | Goldstein | .................... | 714/784 |
| 6,048,090 A | * | 4/2000 | Zook | .......................... | 714/755 |
| 6,061,760 A | * | 5/2000 | Huang | ....................... | 711/112 |
| 6,178,535 B1 | * | 1/2001 | Kajala et al. | ............... | 714/752 |
| 6,317,855 B1 | * | 11/2001 | Horibe | ........................ | 714/752 |
| 6,357,030 B1 | * | 3/2002 | Demura et al. | ............. | 714/755 |

OTHER PUBLICATIONS

"ECMA–120: Data interchange on read–only 120 mm optical data disk (CD–ROM)", ECMA, 1996, pp. 14–45.*

* cited by examiner

Primary Examiner—Guy J. Lamarre
(74) Attorney, Agent, or Firm—Michael D. Bednarek; Shaw Pittman LLP

(57) ABSTRACT

A method and system for optical disk decoding, which is used for decoding an error correction code (ECC) block. The method and system can determine whether it is to perform the outer code decoding or the inner code decoding first. In addition, during the inner code decoding, the EDC checking is performed. After the inner code decoding or the outer code decoding, it is determined whether one of the following is true: (1) the error correction of the ECC block is complete; (2) the number of errors is over the limitation of error correction so that the error-correcting operation cannot be performed; or (3) the decoding operations are performed for a number of times but the correction is not complete. If one of the conditions is true, the inner code decoding or the outer code decoding is terminated. Next, the descrambling and the EDC checking are performed. Being passed in the EDC checking, the data are sent to a host; otherwise, re-transmission of the corresponding data for processing is required. By the invention, it results in reducing the memory access time, increasing the speed of decoding, and improving the error correction capability.

20 Claims, 7 Drawing Sheets

METHOD AND SYSTEM FOR OPTICAL DISK DECODING

This application incorporates by reference Taiwanese application Serial No. 89111797, filed Jun. 16, 2000.

BACKGROUND OF THE INVENTION

1. Field of the Invention

The invention relates to a method and system for digital versatile disk (DVD) decoding, and more particularly to a method and system for improving the error correcting rate and speed of DVD decoding.

2. Description of the Related Art

Referring now to FIG. 1, it illustrates a block diagram of conventional DVD encoding and decoding respectively. In the DVD encoding, firstly, a data message is inputted into an error detection code (EDC) appending unit 102, resulting in a data block which is formed by appending an EDC to the data message. The data block is then inputted into a scrambler 104 for scrambling the data block. After scrambling, sixteen scrambled data blocks are inputted into an outer code encoder 106 for outer code encoding, thus outputting an outer-code parity (PO). Next, the sixteen scrambled data blocks and PO are inputted into an inner code encoder 108 for inner code encoding, thus outputting an inner-code parity (PI). Then, this sixteen scrambled data blocks, PO and PI comprise an error correction code (ECC) block. After inputting the ECC block into an eight-to-fourteen modulation (EFM) modulator 110 for eight-to-fourteen modulation, the modulated ECC block is stored in a DVD 112.

As for DVD decoding, it is the reverse process of the DVD encoding. Firstly, data read from the DVD 112 are transferred to EFM demodulator 114 for performing eight-to-fourteen demodulation, obtaining an ECC block. The ECC block is then inputted into the inner code decoder 116 for inner code decoding. Next, the inner code decoded ECC block is transferred to the outer code decoder 118 for outer code decoding, resulting in a number of scrambled data blocks. The de-scrambler 120 then descrambles the scrambled data blocks, outputting a number of data blocks. Finally, before outputting the data blocks, they are checked by an EDC check unit 122.

Referring to FIGS. 2A–2B, they illustrate a data sector before scrambling and an ECC block respectively. In FIG. 2A, a data sector 200 contains 12 row×172 column data symbols, i.e. a row in the data sector 200 contains 172 bytes. Besides, there is a four-byte EDC followed by the twentieth row in the data sector.

In FIG. 2B, it shows that source data 204 consists of sixteen scrambled data sectors, each of which is designated by numeral 1 to 16 respectively. The source data 204 has 192 rows of data and each row contains 172 bytes, i.e. the source data 204 contains 172 columns of data. When performing outer code encoding, the outer code encoder 106 processes the source data 204 according to the Y-direction, obtaining outer code parity following the columns of the source data 204. The outer code parity, or PO, contains 16 rows of 172-byte data, corresponding to the 172 columns of the source data 204. The source data 204 and the PO are designated a Reed-Solomon (RS) outer code. When performing inner code encoding, the inner code encoder 108 processes the source data 204 and the PO according to the X-direction, obtaining inner code parity following the rows of the source data 204. The inner code parity, or PI, has 208 (=192+16) rows of 10-byte data, corresponding to the 208 rows of the source data 204 and PO. The source data 204, PO and PI comprise the ECC block 206.

Referring to FIG. 3, it shows a DVD decoding system according to the process shown in FIG. 1, in block diagram form. Firstly, an EFM demodulator 304 receives and processes message data read from DVD 302, obtaining the ECC block 206. The ECC block 206 is then delivered through bus 306 to data buffer 308 for storage. Next, inner code decoder 310 reads the ECC block 206 from the data buffer 308 and performs inner code decoding for detecting and correcting errors of the ECC block 206. After that, the inner code decoder 310 writes the corrected data into the data buffer 308. Outer code decoder 312 then reads the corrected ECC block 206 from the data buffer 308 and performs outer code decoding for detecting and correcting errors of the source data 204 in the ECC block 206. After that, the outer code decoder 312 writes the corrected data into the data buffer 308.

Next, descrambling and EDC checking unit 314 reads the source data of the ECC block 206, which are scrambled when encoding, from the data buffer 308 for performing descrambling and EDC check. When the host requests for reading the source data of the data buffer 308, descrambler 316 reads the ECC block 206 from the data buffer 308 for descrambling and then sends the descrambled source data to the host. It is desired to reduce the times of access to the data buffer 308 so that, in the decoding process above, the descrambling and EDC checking unit 314 performs descrambling and EDC check at the same time. Besides, when the EDC check result of the descrambling and EDC checking unit 314 indicates that the source data are corrected, the source data (after descrambling and EDC checking unit 314) are delivered to the host.

In the conventional DVD decoding system described above, there are disadvantages as follows.

1. A data buffer is necessary for every stage of the decoding in the system where respective components share one data buffer. During the decoding, it is required to access to the data buffer for a number of times, resulting in a limitation in the speed of DVD decoding.
2. It is known that the error correction capability of the DVD decoding system can be improved by repeating the inner code and outer code decoding. However, the repetition of the inner code and outer code decoding is time-consuming, and thus the speed of the decoding will be lowered. Since the decoding system cannot differentiate between the region of data which has erroneous data and the region which has not in the source data 204, the inner code or outer code decoding can only be performed for the whole source data 204 for each decoding.
3. If there are too much erroneous data to be corrected, the results of the inner code and outer code decoding may still be mistaken, leading to a situation that some of the data become erroneous after error correction.

SUMMARY OF THE INVENTION

It is therefore an object of the invention to provide a method and system for optical disk decoding by adjusting the sequence of the decoding and performing error detection code (EDC) checking during inner code decoding. In this way, it reduces the memory access time, increases the decoding speed, and improves the error correction capability.

According to the object of the invention, it provides a method for optical disk decoding, which is for decoding an error correction code (ECC) block. The method includes the steps as follows.

(a) It is determined whether it is to perform outer code decoding first. If so, the method proceeds to step (b). If not, the method proceeds to step (d).

(b) Inner code decoding and EDC checking is performed.

(c) It is determined whether one of the conditions is true: (1) error correction is complete; (2) the number of errors is over the limitation of error correction so that the error-correcting operation cannot be performed; or (3) the decoding operations are performed for a number of times but the correction is not complete. If so, the method proceeds to step (f); if not, the method proceeds to step (d).

(d) Outer code decoding is performed.

(e) It is determined whether one of the following is true: (1) the error correction is complete; (2) the number of errors is over the limitation of error correction so that the error-correcting operation cannot be performed; or (3) the decoding operations are performed for a number of times but the correction is not complete. If so, the method proceeds to step (f); if not, the method proceeds to step (b).

(f) Descrambling is performed.

(g) EDC checking is performed.

According to the object of the invention, it provides a method of optical disk inner code decoding, which is for decoding an error correction code (ECC) block. The ECC block includes a number of data sectors each of which includes a number of rows of data. The method includes the steps as follows.

(a1) It is determined whether the K-th data sector corresponding to the I-th row is set to be correct. If so, the method proceeds to step (g1); if not, the method proceeds to steps (b1) and (h1) simultaneously.

(b1) It is determined whether a syndrome corresponding to the I-th row is equal to zero. If so, the method proceeds to steps (e1); if not, the method proceeds to steps (c1).

(c1) Decoding the data of the I-th row is performed.

(d1) It is determined whether the decoding of the data of the I-th row is complete. If so, the method proceeds to step (e1); if not, the method proceeds to step (f1).

(e1) The data of the I-th row are corrected and are set to be correct, and the method proceeds to step (g1).

(f1) An erasure flag corresponding to the I-th row is set to be a first value.

(g1) It is determined whether the inner code decoding of the entire ECC block is complete. If so, the method is terminated; if not, the method is repeated from the step (a1) for the (K+1)th data sector.

(h1) Descrambling is performed.

(i1) It is determined whether the following is true: the K-th data sector is passed in the EDC check and is set to be correct; and no error correction is performed on the K-th data sector. If so, the method proceeds to step (j1); if not, the method proceeds to step (k1).

(j1) The K th data sector is set to be correct. (k1) The K-th data sector is set to be undetermined.

According to the object of the invention, it provides a method for optical disk outer code decoding, which is for decoding an error correction code (ECC) block. The ECC block includes a number of data sectors. Each of the data sectors includes a number of columns of data and each of the columns of data corresponds to one of the data sectors. The method includes the following steps.

(a2) It is determined whether a syndrome corresponding to the J-th column is equal to zero. If so, the method proceeds to step (g2); if not, the method proceeds to step (b2).

(b2) Decoding the data of the J-th column is performed.

(c2) It is determined whether the decoding of the data of the J-th column is complete. If so, the method proceeds to step (d2); if not, the method proceeds to steps (f2).

(d2) It is determined whether the data sector where a correction obtained from the decoding of the step (b2) belongs is passed in the EDC check. If so, the method proceeds to step (e2); if not, the method proceeds to steps (g2).

(e2) The data sector are reserved.

(f2) An erasure flag corresponding to the J-th column is set to be a first value and the method proceeds to step (i2).

(g2) The data of the J-th column are corrected.

(h2) The J-th column is set to be correct.

(i2) It is determined whether the outer code decoding of the entire EGG block is complete. If so, the method is terminated; if not, the method is repeated from the step (a2) after increasing the value of J by one.

According to the object of the invention, it provides a system for optical disk decoding, which is for receiving message data from an optical disk, and for decoding an error correction code (ECC) block of the message data. The system includes an eight-to-fourteen modulation (EFM) demodulator, an inner code decoder, an outer code decoder, a descrambling and EDC checking unit, and a descrambler. The EFM demodulator is used for receiving the message data from the optical disk and performing EFM demodulation of the message data. After EFM demodulation, the ECC block is obtained. The inner code decoder is for performing inner code decoding of the ECC block while the outer code decoder is for performing outer code decoding of the ECC block. The descrambling and EDC checking unit is used for performing descrambling and EDC checking. The descrambler is for performing descrambling. The ECC block is inputted into the descrambling and EDC checking unit as the ECC block is inputted into the inner code decoder. In addition, the EDC checking of the ECC block is performed during the outer code decoding of the ECC block.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

Figure 4:
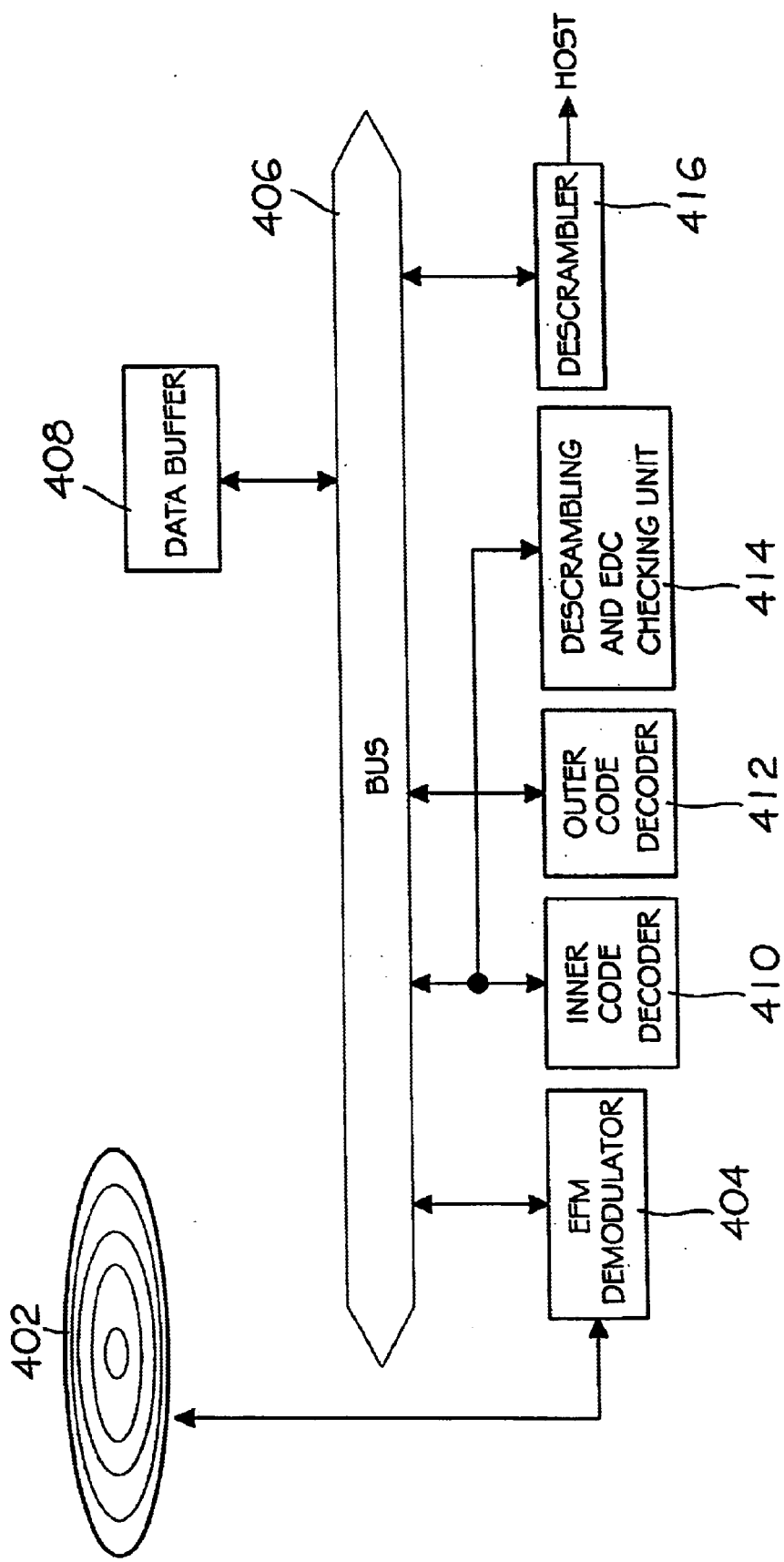
FIG. 4 is a block diagram of a DVD decoding system according to a preferred embodiment of the invention.

Referring to FIG. 4, it illustrates a DVD decoding system according to a preferred embodiment of the invention in block diagram form. Firstly, message data stored in a DVD 402 are transferred to an EFM demodulator 404. The EFM demodulator 404 demodulates the message data, resulting in an ECC block 206. The ECC block 206 is then written into a data buffer 408 via a bus 406. After that, the ECC block 206 is processed by an inner code decoder 410, an outer code decoder 412, a descrambling and EDC checking unit 414, and a descrambler 416 respectively, resulting in the required message data. The required message data are then delivered to the host. The difference between the DVD decoding system according to the invention and the conventional DVD decoding system is that the ECC block 206 are inputted into the descrambling and EDC checking unit 414 as the ECC block 206 are inputted into the inner code decoder 410.

Figure 5:
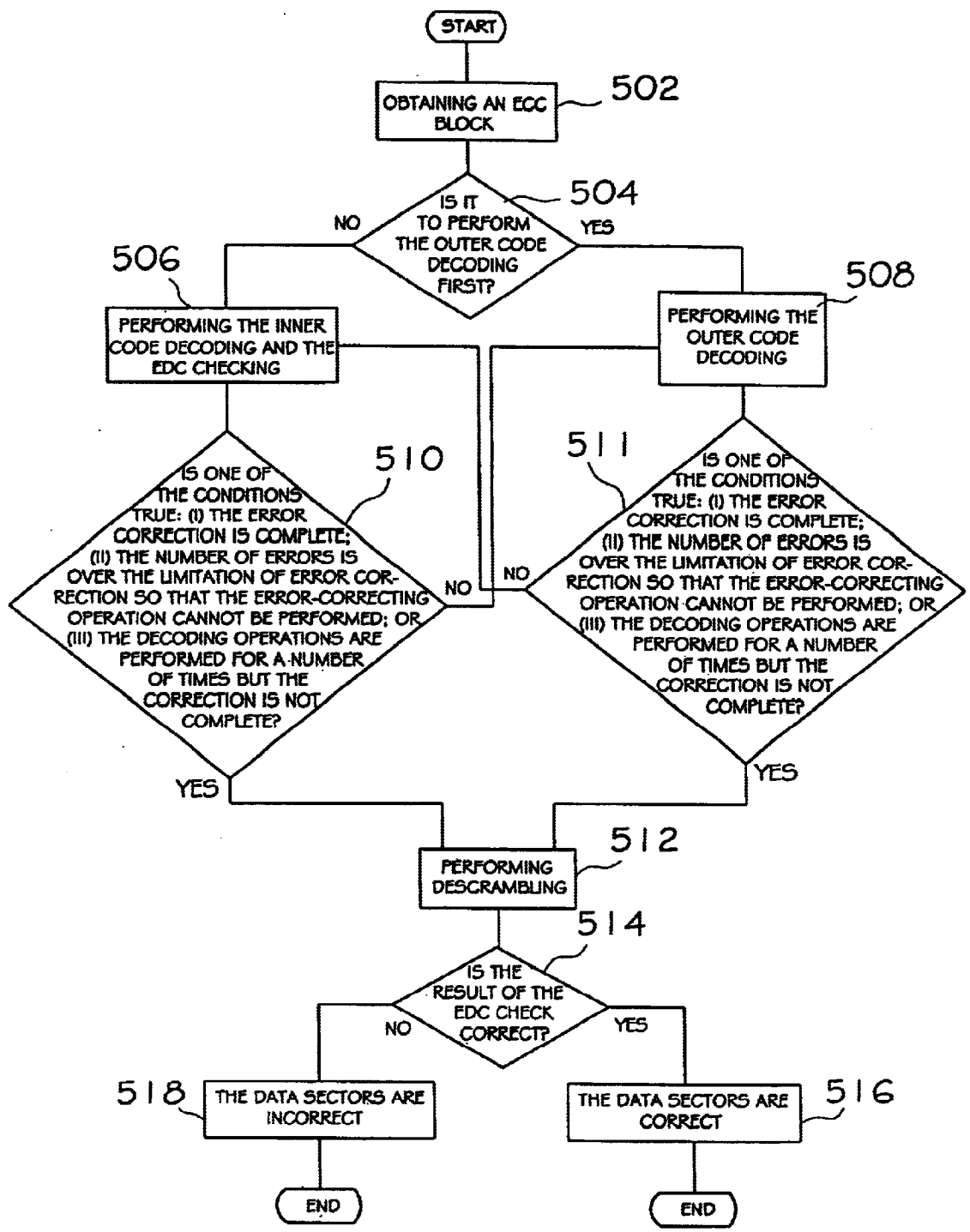
FIG. 5 is a flowchart of a DVD decoding method according to a preferred embodiment of the invention.

Referring to FIG. 5, it illustrates a DVD decoding method according to a preferred embodiment of the invention. The method begins and proceeds to step 502 in which an ECC block is obtained from an EFM demodulator 404. The method then proceeds to step 504. At step 504, it is determined whether it is to perform outer code decoding. If so, the method proceeds to step 508. If not, the method proceeds to step 506.

Generally, a conventional DVD decoding method proceeds to outer code decoding after completing inner code decoding. However, it is proved by experiment that it makes no difference to the result whether the outer code decoding is performed after or before the inner code decoding provided that there is enough time to perform outer code decoding and inner code decoding repeatedly. Since the times of repetition of the decoding is limited, EDC checking is also performed during performing the inner code decoding in the embodiment according to the invention. In this way, the quality of the received message data and the determination as to whether to perform the outer code decoding before the inner code decoding can greatly affect the speed of decoding.

For instance, the quality of the DVD, the performance of the EFM demodulator, and the influence of interference on message data during delivery probably lead to errors of the data in the ECC block 206. Performing mathematical operations on the inner code parity (PI) and outer code parity (PO), the inner code decoding 410 and outer code decoding 412 obtains the corresponding error values and error locations. From this, the inner code decoding 410 and outer code decoding 412 can correct the errors of the data in the ECC block 206.

For message data of high quality, only a few number of errors occur in an ECC block of the message data. In this way, the errors can be corrected by performing either the inner code decoding or outer code decoding. In this case, it is prefer to perform the inner code decoding. As for message data of quality of just above the average, a portion of the errors can be corrected by performing the inner code decoding and then the outer code decoding. For the other portion of the errors, they can be corrected by performing the outer code decoding and then the inner code decoding. In this case, it is better to perform the outer code decoding.

Figure 1:
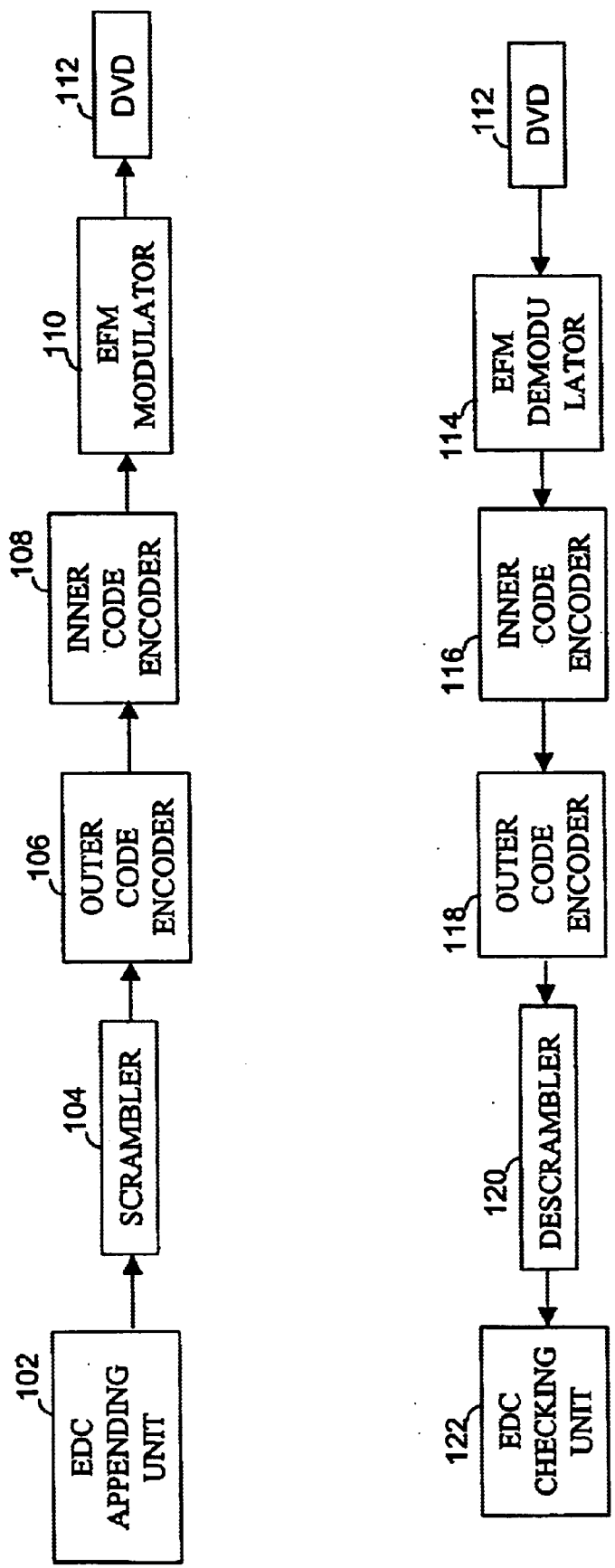
FIG. 1 (Prior Art) is a block diagram of conventional DVD encoding and decoding respectively.
Figure 2B:
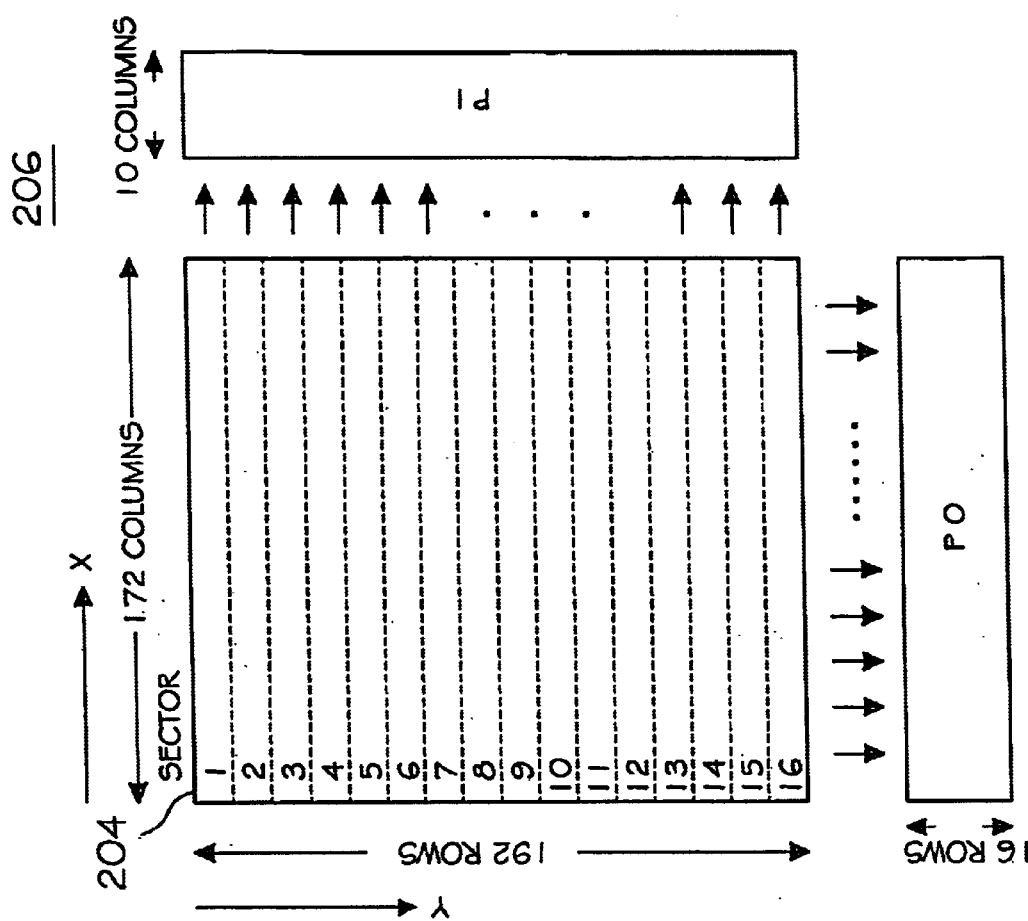
FIG. 2B (Prior Art) illustrates an ECC block.
Figure 2A:
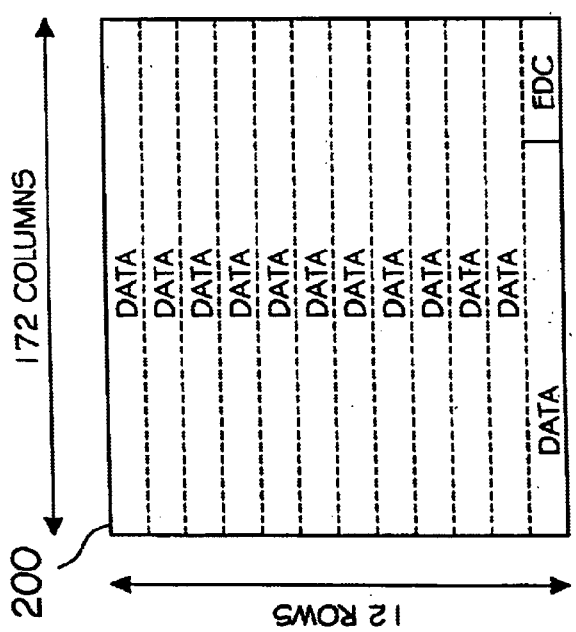
FIG. 2A (Prior Art) illustrates a data sector before scrambling.
Figure 3:
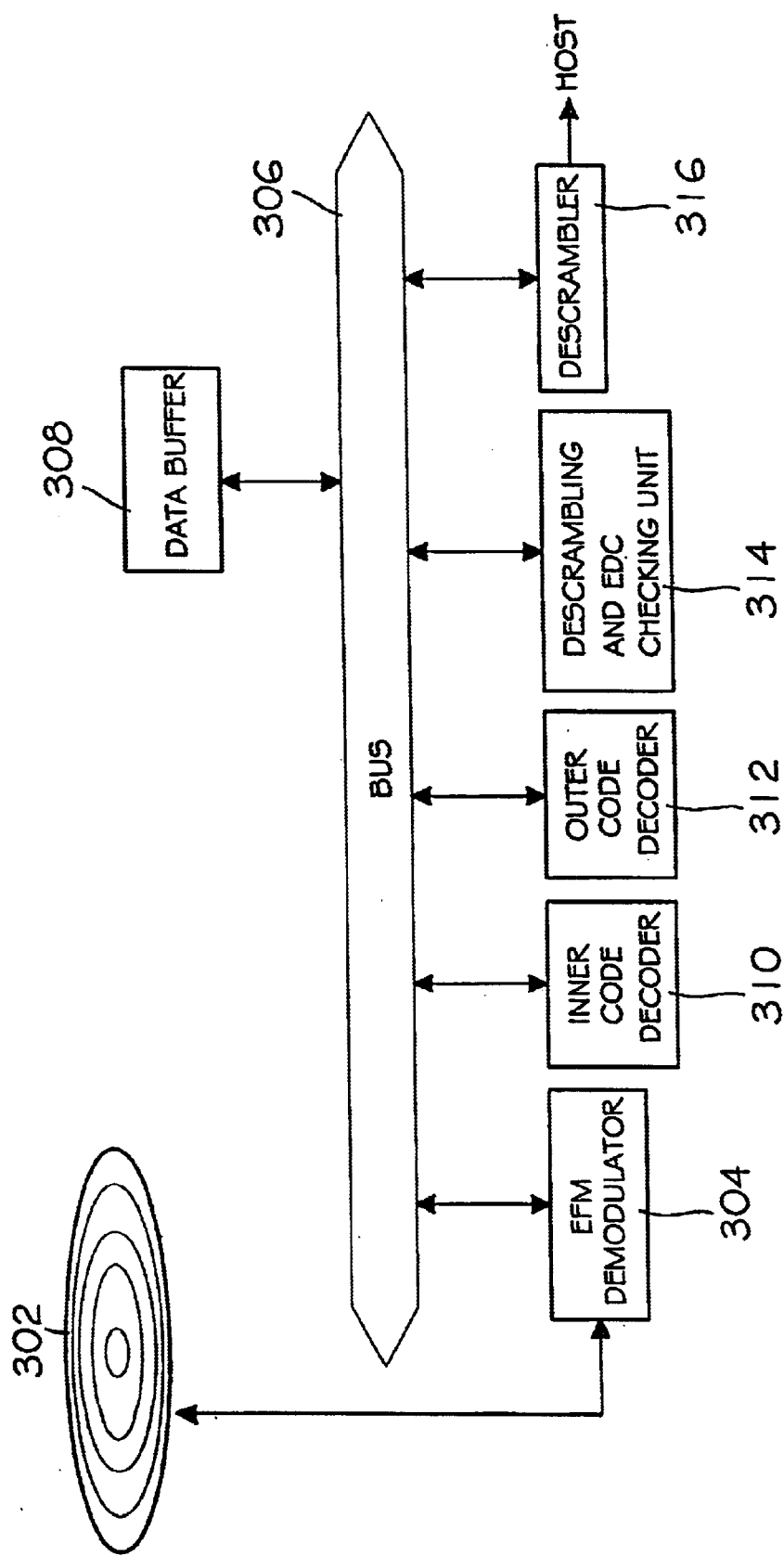
FIG. 3 (Prior Art) is a block diagram of a DVD decoding system according to the process shown in FIG. 1.

Turning back now to FIG. 5, at step 506, the inner code decoding and the EDC checking are performed. It is the feature of the invention that the inner code decoding and the EDC checking are performed at the same time. When performing the inner code decoding, the sequence of inputting data sectors as shown in FIGS. 2A–2B into the inner code decoder 510 is the same as the sequence of inputting data sectors into the descrambling and EDC checking unit 414. Therefore, while performing the inner code decoding, data sectors are descrambled and the EDC checking is then performed on the descrambled data sectors. During the inner code decoder 410 receives and processes a PI, values in the data register of the EDC checking unit are hold so that the EDC checking unit does not process the PI. Once the inner code decoder 410 completes the inner code decoding of all twelve-row data of the data sector, the result of the EDC checking is obtained. If the data sector passes the EDC checking and the data sector does not have any correction during the on inner code decoding, it indicates that the data sector is correct and the descrambling is correct as well. Thus, the EDC checking for the data sector can be omitted, resulting in a reduction of the decoding time, or a increase in the speed of decoding.

After step 506, the method proceeds to step 510. At step 510, a determination is made whether one of the following conditions is true: (i) the error correction is complete; (ii) the number of errors is over the limitation of error correction so that the error-correcting operation cannot be performed; or (iii) the decoding operations are performed for a number of times but the correction is not complete. If one of these conditions is true, the method proceeds to step 512. If all of these conditions are not true, the method proceeds to step 508.

At step 508, the outer code decoding is performed and the method then proceeds to step 511. At step 511, it is determined whether one of the following conditions is true: (i) the error correction is complete; (ii) the number of errors is over the limitation of error correction so that the error-correcting operation cannot be performed; or (iii) the decoding operations are performed for a number of times but the correction is not complete. If one of these conditions is true, the method proceeds to step 512. If all of these conditions are not true, the method proceeds to step 506.

At step 512, the descrambling is performed, where only the data sectors that the EDC checking are not performed on at step 506 are descrambled. Next, the method proceeds to step 514. At step 514, it is determined whether the result of the EDC check is correct, i.e. the EDC checking is performed on the descrambled data sectors obtained at step 516. If it is determined that the data sectors pass in the EDC check, the method proceeds to step 516. At step 516, it indicates that the data sectors are correct. Thus, the data sectors are ready for sending to the host. If it is determined that the data sectors do not pass in the EDC check, the method proceeds to step 518. At step 518, it indicates that the data sectors are incorrect. In this case, the DVD decoding system may require a re-transmission of the data sector.

To sum up, in the invention, the performing sequence of the inner code decoding and the outer code decoding is changed, and the EDC checking can be performed as the inner code decoding is performing. Besides, in the EDC checking, each data sector can be corresponded to a flag for indicating whether the EDC checking is performed on the data sector. In this way, performing the EDC checking and the inner code decoding simultaneously results in a reduction of times of access to the data buffer, i.e. a decrease in the average access time. In addition, when the EDC checking flag is employed, the redundant EDC checking in step 514 may be omitted for the data sectors that the EDC checking has been performed on at step 514. In this way, speed of the DVD decoding is further increased.

Figure 6:
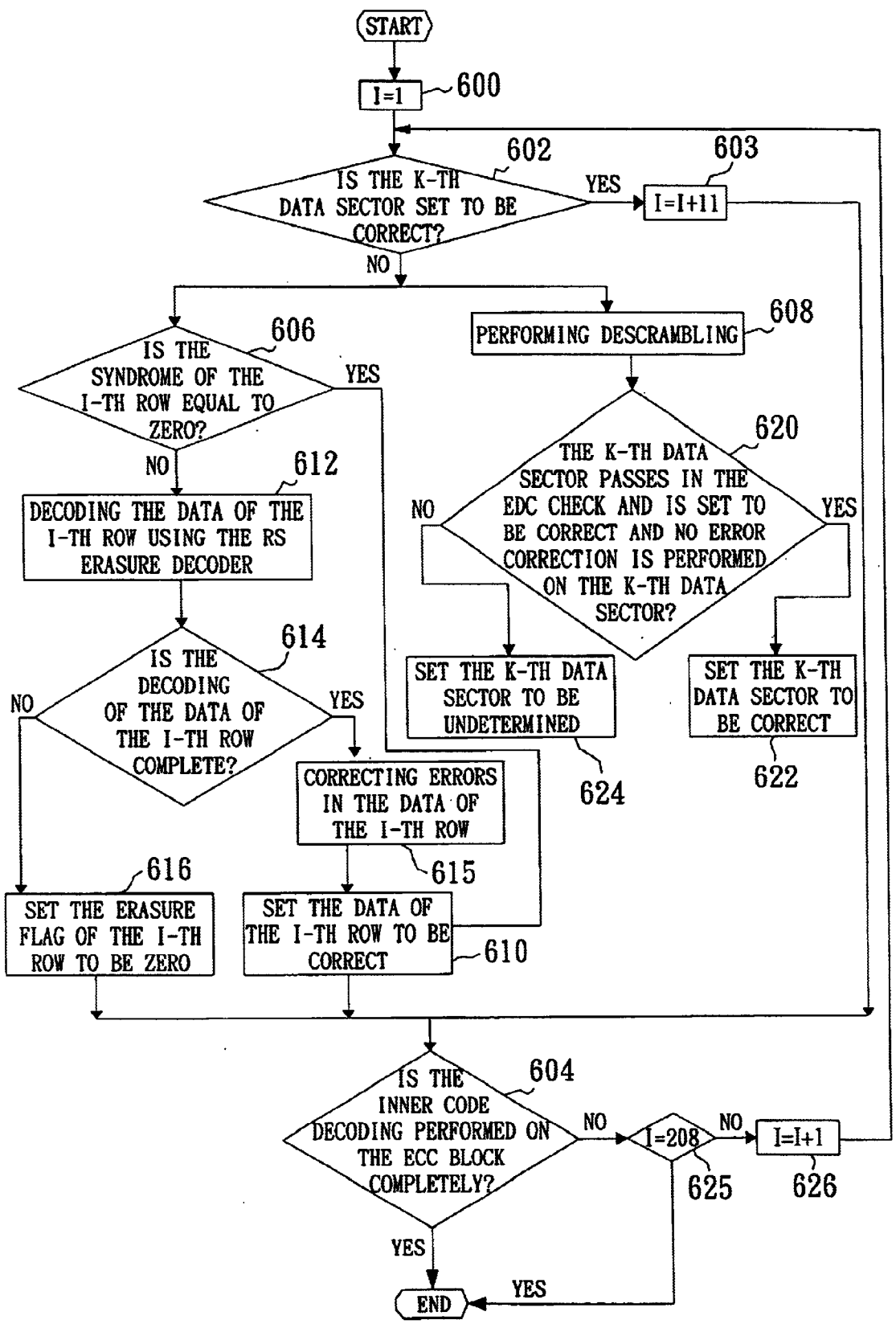
FIG. 6 is a flowchart of detailed steps of the inner code decoding and the EDC checking in FIG. 5.

Referring now to FIG. 6, it shows the detailed steps of the inner code decoding and the EDC checking in FIG. 5 in a flowchart. In the following, three parameters are introduced, namely, I, J and K for indicating the row, column and sector numbers respectively. The method shown in FIG. 6 begins and proceeds to step 600 where I is set to one. Referring to FIGS. 2A–2B, a data sector 200 contains data of 12 row by 172 column and an ECC block 206 consists of 16 data sectors 200 (192 rows×172 columns), a PO code, and a PI code, i.e. an ECC block 206 has 208 rows by 182 columns data. In an ECC block 206, each row of data has a corresponding erasure flag, each column has a corresponding erasure flag, and each data sector has a corresponding checking flag. For the initial values, all erasure flags are set to be one and all checking flags are set to zero.

Next, the method proceeds to step 602. At step 602, a determination is made whether the K-th data sector in the I-th row is set to be correct. To be specific, it is determined whether the checking flag corresponding to the K-th data sector is set to one. If so, the method proceeds to step 603. At step 603, I is increased by eleven, corresponding to the next data sector, i.e. the (K+1)-th data sector, and the method proceeds to step 604. If not, the method proceeds to steps 606 and 608 simultaneously. At step 606, it is determined whether the syndrome of the I-th row is zero. If so, the method proceeds to step 610. If not, the method proceeds to step 612.

For the computation of the syndromes S, it is as follows. Firstly, set $S=(S_1, S_2, \ldots, S_{2T})$, where 2T is the number of parity codes. When performing the inner code decoding, 2T is set to 10. When performing the outer code decoding, 2T is set to 16. The syndromes $S_k$ $_{(k=1 \sim 2T)}$ are obtained from:

$$S_k = \Sigma_{i=0 \sim N-1} (r_i \alpha^{ik}) \text{ for } k=0 \sim 2T-1,$$

where N is set to 182 and $r_i$ $_{(i=1 \sim N)}$ correspond to the 182 data bytes of the I-th row respectively when performing the inner code decoding; and N is set to 208 and $r_i$ $_{(i=1 \sim N)}$ correspond to the 208 data bytes of the J-th row respectively when performing the outer code decoding. $\alpha$ is an element of a finite field $GF(2^8)$ and is a root of a primitive polynomial P(x):

$$P(x) = x^8 + x^4 + x^3 + x^2 + 1.$$

At step 612, error values and error locations of the I-th row are obtained by using a Reel-Solomon (RS) erasure decoder in the inner code decoding 410 and the data of the I-th row are decoded. Next, the method proceeds to step 614. At step 614, it is determined whether the decoding of the data of the I-th row is complete. To be specific, it is determined whether the error locations found after decoding are located within the first to the 182nd columns. If so, it indicates that the decoding of the I-th row is complete and the method proceeds to step 615. If it is determined that the error location obtained from the decoding represents a location which is over the 182nd column, it indicates the decoding is incorrect and the method proceeds to step 616. At step 615, error correction are performed on the I-th row data, i.e. the errors found in the I-th row are corrected. The method then proceeds to step 610. At step 610, the data of I-th row is set to be correct. For example, set the erasure flag corresponding to the data of the I-th row to be one. At step 616,. After steps 610 and 616, the method proceeds to step 604.

When the inner code decoding 410 is performing steps 606, 610, 612, 614, 616 and 618, the descrambling and EDC checking unit 414 is performing steps 608, 620, 622 and 624. At step 608, when I is smaller than 193, the descrambling and EDC checking unit 414 performs descrambling on the K-th data sector, where only the data of the I-th row are descramled in each looping. Next, the method proceeds to step 620. At step 620, when I=12K, which indicates that the descrambling and EDC checking are performed on the K-th data sector, it is determined whether the following is true: the K-th data sector passes in the EDC check and is set to be correct correctness and no error correction is performed on the K-th data sector. If so, the method proceeds to step 622. At step 622, the K-th data sector is set to be correct, which can be represented by setting the erasure flag of the K-th data sector to be one. If not, the method proceeds to step 624. At step 624, the K-th data sector is set to be undetermined, which can be represented by setting the erasure flag of the K-th data sector to be zero. In addition, the data from the $193^{rd}$ to the $208^{th}$ rows do not require to perform the descrambling in step 608.

At step 604, it is determined whether the inner code coding is performed on the ECC block completely. In other words, it is determined whether the checking flags corresponding to all data sectors of the ECC block are equal to one. If so, the flow in FIG. 6 ends. If not, the method proceeds to step 625 where it is determined whether I is equal to 208. If so, the flow in FIG. 6 ends and the method proceeds to step 510. If not, the method proceeds to step 626. At step 626, I is increased by one and the method returns to step 602.

In the flowchart of the inner code decoding shown in FIG. 6, the inner code decoding and the EDC checking is performed simultaneously. In addition, before performing the inner code decoding on each row of data, it is determined whether the row of data is set to be correct. If so, it indicates that the inner code decoding and the EDC checking is redundant and will not perform on this row of data, resulting in reducing the time of decoding. Moreover, before performing step 612, at step 606, it is determined whether the data of the row are correct by using the syndromes. If so, the operation of the RS erasure decoder can be omitted for this row of data. In this way, the speed of the decoding is also increased.

At step 616, the erasure flag of the I-th row is set to be zero so that the outer code decoding can be performed faster and the error correction capability can be enhanced. When the erasure flag of the I-th row is set to be zero, it indicates that the I-th row includes errors that have not been corrected. When the outer code decoding is performing, according to the erasure flag of zero, the number of error values and locations that the outer code decoder 412 obtains can be increased. Thus, more number of errors can be corrected.

In the case that the K-th data sector passes in the EDC check and is set to be correct but the data sector has been done for correction, the correctness of the data sector is questionable. It is possible the inner code decoding has done something incorrectly such that the correct data are changed to be incorrect. In this case, the K-th data sector is set to be undetermined at step 624 so that the EDC checking is performed again for this data sector in the following step 514.

Figure 7:
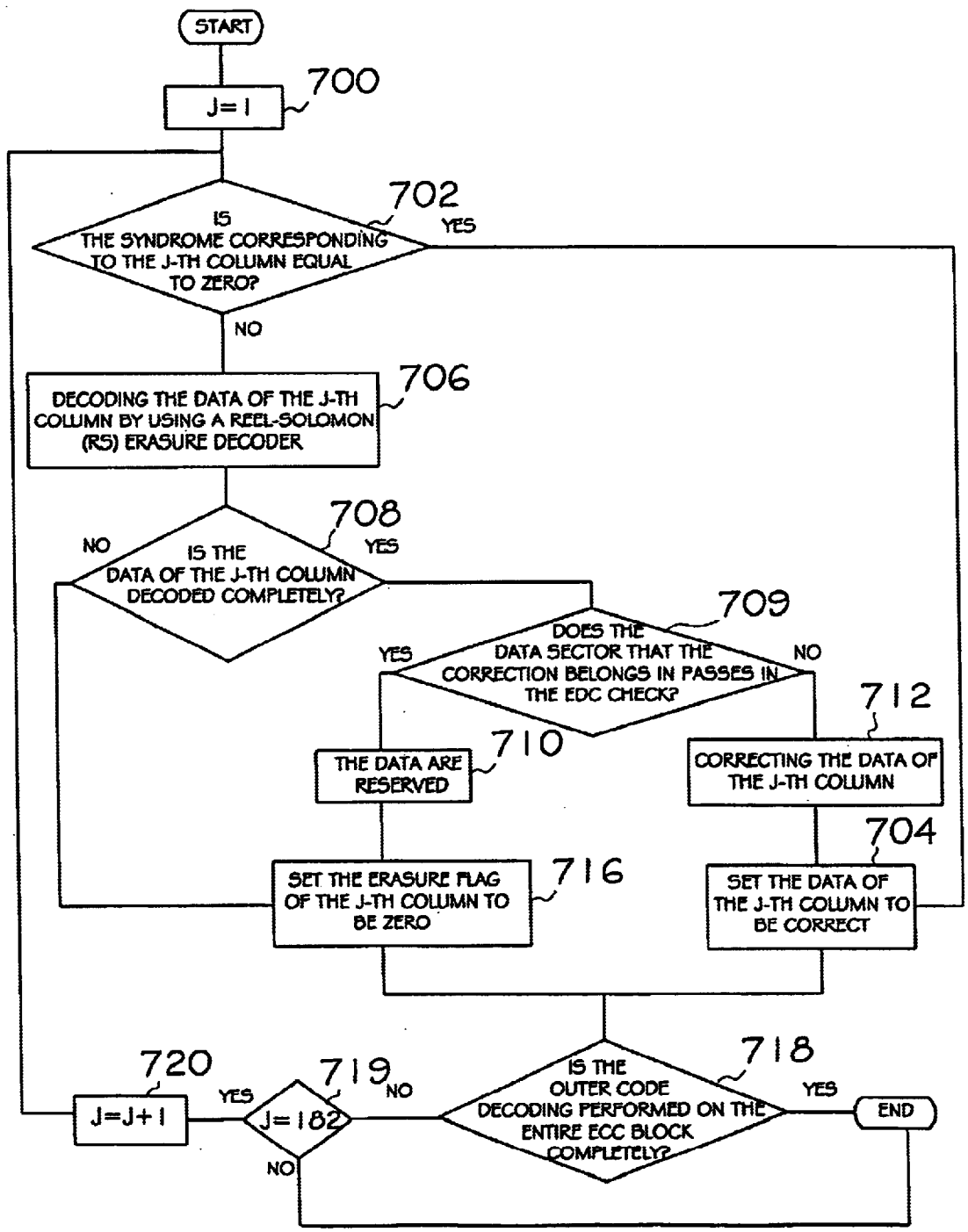
FIG. 7 is a flowchart of detailed steps of the outer code decoding in FIG. 5.

Referring now to FIG. 7, it illustrates a flowchart of detailed steps of the outer code decoding in FIG. 5. In FIG. 7, the method begins and proceeds to step 700 where the parameter J is set to be 1. Next, the method proceeds to step 702. At step 702, it is determined whether the syndrome corresponding to the J-th column is equal to zero. If so, the method proceeds to step 704 where the data of the J-th column is set to be correct. In other words, the erasure flag of the J-th column is set to be one. If not, the method proceeds to step 706. At step 706, the decoding is performed on the data of the J-th column by using a Reel-Solomon (RS) erasure decoder in the outer code decoding 412, i.e. using an RS erasure decoder to found error values and error locations of the J-th column.

After performing step 706, the method proceeds to step 708. At step 708, it is determined whether the data of the J-th column is decoded completely. In other words, it is determined whether error locations obtained from the decoding are located in the region from the first to the $208^{th}$ rows. If so, the method proceeds to step 709. If not, the method proceeds to step 716. At step 709, it is determined whether the data sector that corrections (including error locations and error values) obtained from the decoding above belong and correspond to passes in the EDC check. If so, the method proceeds to step 710. At step 710, the data are reserved, i.e. error correction will not be performed on the data of the J-th column. After step 710, the method proceeds to step 716 where the erasure flag of the J-th column is set to be zero. If, at step 709, it is determined that the data sector where the corrections belongs fails in the EDC check, the method proceeds to step 712 where the data of the J-th column is corrected. After step 712, the method proceeds to step 704 where the data of the J-th column is set to be correct. In other words, the erasure flag of the J-th column is set to be one.

After steps 704 or 716, the method proceeds to step 718. At step 718, it is determined whether the outer code decoding is performed on the entire ECC block completely. If so, the process in FIG. 7 ends and the method proceeds to step 514. If not, the method proceeds to step 719. At step 719, it is determined whether the value of J is equal to 182. If so, the process in FIG. 7 ends. If not, the method proceeds to step 720. At step 720, the value of J is increased by one and the method is repeated from step 702, performing the process for the next column.

In the process shown in FIG. 7, at step 709, it is determined whether the data sector where corrections, obtained from the decoding, belong passes in the EDC check. The determination is made for avoiding a possible situation that the correct data sector may be changed to be incorrect after the error correcting if the error correction is performed on the data sector that passes in the EDC check. In this case, it is necessary to avoid the error correction for the data sector and so the method proceeds to step 710 where the data sector is reserved, i.e. the data sector remains unchanged.

Referring now to FIG. 5, steps 506 and 508 are performed repeatedly. When it is determined that, at steps 510 or 511, one of the conditions is true, the method proceeds to step 512 and thus the looping of the steps 506 and 508 is ended. At steps 506 or 508, it is determined whether the error correction is complete. It is equivalent to a determination as to whether the erasure flags corresponding to all rows and columns are set to one. If so, it indicates that the ECC block is corrected completely. Thus, there is no error in the data of the ECC block and the required data can be transmitted to the host.

On the other hand, the determination as to whether the correction is unable to be performed since the errors are over the limitation of the error correction can be made by finding out the number of erasure flags that are of zero. If the number of zero-valued erasure flags exceeds a limitation of the decoding system, it indicates that the ECC block has too many errors to be corrected. In this case, the DVD decoding system will not perform error correction on the ECC block. Finally, for the determination as to whether the decoding operations are performed for a number of times but the correction is not complete, the DVD decoding system can define maximum numbers of times of performing the inner code decoding and the outer code decoding. If the number of times of the decoding exceeds the maximum value, it indicates that the decoding operations are performed for many times but the correction is not complete.

The DVD decoding method and system are disclosed in the above embodiment, in which the decoding sequence is changed and the EDC checking is performed during performing the inner code decoding. In this way, it results in reducing the time of access to memory, increasing the speed of the decoding, and improving the error correction capability.

While the invention has been described by way of example and in terms of the preferred embodiment, it is to be understood that the invention is not limited to the disclosed embodiment. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method for optical disk decoding, for decoding an error correction code (ECC) block, the method comprising the steps of:
   (a) determining whether it is to perform outer code decoding first:
      if not, proceeding to step (b); or
      if so, proceeding to step (d);
   (b) performing inner code decoding and EDC checking;
   (c) determining whether one of the following is true: (1) error correction is complete; (2) the number of errors is over the limitation of error correction so that the error-correcting operation cannot be performed; or (3) the decoding operations are performed for a number of times but the correction is not complete:
      if so, proceeding to step (f); or
      if not, proceeding to step (d);
   (d) performing outer code decoding;
   (e) determining whether one of the following is true: (1) the error correction is complete; (2) the number of errors is over the limitation of error correction so that the error-correcting operation cannot be performed; or (3) the decoding operations are performed for a number of times but the correction is not complete:
      if so, proceeding to step (f) or
      if not, proceeding to step (b);
   (f) performing descrambling; and
   (g) performing EDC checking.

2. A method for optical disk decoding according so claim 1, wherein the ECC block includes a plurality of first data sectors and a plurality of second data sectors, the first data sectors are passed in the EDC checking of she step (b) and the second data sectors are not passed in the EDC checking of the step (b).

3. A method for optical disk decoding according to claim 2, wherein, after the step (g), the method further comprises the steps of:
   (h) if the second data sectors are passed in the EDC checking, proceeding to step (i); otherwise, proceeding to step (j);
   (i) outputting the second data sectors so a host; and
   (j) re-transmitting the second data sectors.

4. A method for optical disk decoding according so claim 1, wherein the ECC block includes a plurality of data sectors, each data sector includes a plurality of rows of data, wherein the step (b) comprises the steps of:
- (a1) determining whether the K-th data sector corresponding to the I-th row is set to be correct:
  if so, proceeding to step (g1); or
  if not, proceeding to steps (b1) and (h1) simultaneously;
- (b1) determining whether a syndrome corresponding to the I-th row is equal to zero:
  if so, proceeding to step (e1); or
  if not, proceeding to steps (c1)
- (c1) decoding the data of the I-th row;
- (d1) determining whether the decoding of the data of the I-th row is complete:
  if so, proceeding to step (e1); or
  if not, proceeding to step (f1);
- (e1) correcting the data of the I-th row, setting the data of the I-th row to be correct and proceeding to step (g1);
- (f1) setting an erasure flag corresponding to the I-th row to be a first value;
- (g1) determining whether the inner code decoding of the entire ECC block is complete:
  if so, terminating the step (b); or
  if not, repeating from the step (a1) for the (K+1)th data sector;
- (h1) performing descrambling;
- (i1) determining whether the following is true: the K-th data sector is passed in the EDC check and is set to be correct and no error correction is performed on the K-th data sector:
  if so, proceeding to step (j1); or
  if not, proceeding to step (k1);
- (j1) setting the K-th data sector to be correct; and
- (k1) setting the K-th data sector to be undetermined.

5. A method for optical disk decoding according to claim 4, wherein setting the data of the I-th row to be correct in the step (e1) is equivalent to setting the erasure flag corresponding to the data of the I-th row to be a second value.

6. A method for optical disk decoding according to claim 5, wherein the first value is zero and the second value is one.

7. A method for optical disk decoding according to claim 4, wherein setting the K-th data sector to be correct in the step (j1) is equivalent to setting a checking flag corresponding to the K-th data sector to be a second value.

8. A method for optical disk decoding according to claim 7, wherein setting the K-th data sector to be undetermined in the step (k1) is equivalent to setting the checking flag corresponding to the K-th data sector to be the first value.

9. A method for optical disk decoding according to claim 1, wherein the ECC block includes a plurality of data sectors, the ECC block includes a plurality of columns of data, and each of the columns of data corresponds to one of the data sectors, wherein the step (d) comprises the steps of:
- (a2) determining whether a syndrome corresponding to the J-th column is equal to zero:
  if so, proceeding to step (g2); or
  if not, proceeding to step (b2);
- (b2) decoding the data of the J-th column;
- (c2) determining whether the decoding of the data of the J-th column is complete:
  if so, proceeding to step (d2); or
  if not, proceeding to steps (f2);
- (d2) determining whether the data sector where a correction obtained from the decoding of the step (b2) belongs is passed in the EDC check:
  if so, proceeding to step (e2); or
  if not, proceeding to steps (g2);
- (e2) reserving the data sector;
- (f2) setting an erasure flag corresponding to the J-th column to be a first value and proceeding to step (i2);
- (g2) correcting the data of the J-th column;
- (h2) setting the J-th column to be correct; and
- (i2) determining whether the outer code decoding of the entire ECC block is complete:
  if so, terminating the step (d); or
  if not, repeating from the step (a2) for the data of the (J+1)th column.

10. A method for optical disk decoding according to claim 9, wherein setting the data of the J-th column to be correct in the step (h2) is equivalent to setting the erasure flag corresponding to the data of the J-th column to be a second value.

11. A method for optical disk decoding according to claim 10, wherein the first value is zero and the second value is one.

12. A method for optical disk inner code decoding, for decoding an error correction code (ECC) block, the ECC block including a plurality of data sectors, each data sector including a plurality of rows of data, the method comprising the steps of
- (a1) determining whether the K-th data sector corresponding to the I-th row is set to be correct:
  if so, proceeding to step (g1); or
  if not, proceeding to steps (b1) and (h1) simultaneously;
- (b1) determining whether a syndrome corresponding to the I-th row is equal to zero:
  if so, proceeding to step (e1); or
  if not, proceeding to steps (c1)
- (c1) decoding the data of the I-th row;
- (d1) determining whether the decoding of the data of the I-th row is complete:
  if so, proceeding to step (e1); or
  if not, proceeding to step (f1);
- (e1) correcting the data of the I-th row, setting the data of the I-th row to be correct and proceeding to step (g1);
- (f1) setting an erasure flag corresponding to the I-th row to be a first value;
- (g1) determining whether the inner code decoding of the entire ECC block is complete:
  if so, terminating The method; or
  if not, repeating from the step (a1) for the (K+1)th data sector;
- (h1) performing descrambling;
- (i1) determining whether the following is true: the K-th data sector is passed in the EDC check and is set to be correct and no error correction is performed on the K-th data sector:
  if so, proceeding to step (j1); or
  if not, proceeding to step (k1);
- (j1) setting the K-th data sector to be correct; and
- (k1) setting the K-th data sector to be undetermined.

13. A method for optical disk decoding according to claim 12, wherein setting the data of the I-th row to be correct in the step (e1) is equivalent to setting the erasure flag corresponding to the data of the I-th row to be a second value.

14. A method for optical disk decoding according to claim 13, wherein the first value is zero and the second value is one.

15. A method for optical disk decoding according to claim 12, wherein setting the K-th data sector to be correct in the step (j1) is equivalent to setting a checking flag corresponding to the K-th data sector to be a second value.

16. A method for optical disk decoding according to claim 12, wherein setting the K-th data sector to be undetermined in the step (k1) is equivalent to setting the checking flag corresponding to The K-th data sector to be the first value.

17. A method for optical disk outer code decoding, for decoding an error correction code (ECC) block, the ECC block including a plurality of data sectors, the ECC block including a plurality of columns of data, each of the columns of data corresponding to one of the data sectors, the method comprising the steps of:

- (a2) determining whether a syndrome corresponding to the J-th column is equal to zero:
  - if so, proceeding to step (g2); or
  - if not, proceeding to step (b2);
- (b2) decoding the data of the J-th column;
- (c2) determining whether the decoding of the data of the J-th column is complete:
  - if so, proceeding to step (d2); or
  - if not, proceeding to steps (f2);
- (d2) determining whether the data sector where a correction obtained from the decoding of the step (b2) belongs is passed in the EDC check:
  - if so, proceeding to step (e2); or
  - if not, proceeding to steps (g2);
- (e2) reserving the data sector;
- (f2) setting an erasure flag corresponding to the J-th column to be a first value and proceeding to step (i2);
- (g2) correcting the data of the J-th column;
- (h2) setting the J-th column to be correct; and
- (j2) determining whether the outer code decoding of the entire ECC block is complete:
  - if so, terminating the method; or
  - if not, repeating from the step (a2) after increasing the value of J by one.

18. A method for optical disk decoding according to claim 17, wherein setting the data of the J-th column to be correct in the step (h2) is equivalent to setting the erasure flag corresponding to the data of the J-th column to be a second value.

19. A method for optical disk decoding according to claim 17, wherein the first value is zero and the second value is one.

20. A system for optical disk decoding, for receiving message data from an optical disk, and for decoding an error correction code (ECC) block of the message data, the system comprising:

- an eight-to-fourteen modulation (EFM) demodulator for receiving the message data from the optical disk and performing EFM demodulation of the message data, obtaining the ECC block;
- an inner code decoder for performing inner code decoding of the ECC block;
- an outer code decoder for performing outer code decoding of the ECC block;
- a descrambling and EDC checking unit for performing descrambling and EDC checking; and
- a descrambler for performing descrambling;
- wherein the ECC block is inputted into the inner code decoder and the descrambling and EDC checking unit simultaneously, and EDC checking of the ECC block is performed during outer code decoding of the ECC block.

* * * * *